US006993814B2

(12) United States Patent
Adler

(10) Patent No.: US 6,993,814 B2
(45) Date of Patent: Feb. 7, 2006

(54) METHOD OF FABRICATING A CAPACITOR HAVING SIDEWALL SPACER PROTECTING THE DIELECTRIC LAYER

(75) Inventor: Eric Adler, Jericho, VT (US)

(73) Assignee: International Business Machines Corporation, Armonk, NY (US)

(*) Notice: Subject to any disclaimer, the term of this patent is extended or adjusted under 35 U.S.C. 154(b) by 205 days.

(21) Appl. No.: 10/057,185

(22) Filed: Jan. 25, 2002

(65) Prior Publication Data

US 2002/0071237 A1   Jun. 13, 2002

Related U.S. Application Data

(62) Division of application No. 09/616,951, filed on Jul. 14, 2000, now Pat. No. 6,344,964.

(51) Int. Cl.
*H01G 7/00*  (2006.01)

(52) U.S. Cl. .............. 29/25.42; 29/25.41; 29/841; 29/DIG. 16; 438/689

(58) Field of Classification Search ........... 29/25.41, 29/25.42, 831, 830, 852, 847, DIG. 16, 841; 361/306.3, 308.2, 311–313, 321.4, 321.5, 361/301.4, 301.3; 257/303, 306, 316, 530, 257/301; 438/238–256, 381–398, 622, 689, 438/690, 430; 216/41
See application file for complete search history.

(56) References Cited

U.S. PATENT DOCUMENTS

| 4,172,758 | A | * | 10/1979 | Bailey et al. ............... 216/41 X |
| 5,272,101 | A | | 12/1993 | Forouhi et al. |
| 5,330,931 | A | | 7/1994 | Emesh et al. |
| 5,356,833 | A | * | 10/1994 | Maniar ..................... 437/187 |
| 5,371,700 | A | | 12/1994 | Hamada |
| 5,378,909 | A | | 1/1995 | Chong et al. |
| 5,442,213 | A | | 8/1995 | Okudaira et al. |
| 5,452,178 | A | | 9/1995 | Emesh et al. |
| 5,489,548 | A | | 2/1996 | Nishioka et al. |
| 5,633,781 | A | | 5/1997 | Saenger et al. |
| 5,742,472 | A | * | 4/1998 | Lee et al. ............... 438/396 X |
| 5,789,320 | A | * | 8/1998 | Andricacos ................ 438/678 |
| 5,795,819 | A | * | 8/1998 | Motsiff et al. ........... 438/622 X |
| 5,825,609 | A | | 10/1998 | Andricacos et al. |
| 5,834,348 | A | | 11/1998 | Kwon et al. |
| 5,843,817 | A | | 12/1998 | Lee et al. |
| 5,879,956 | A | | 3/1999 | Seon et al. |
| 5,893,734 | A | * | 4/1999 | Jeng ........................ 438/239 |
| 6,184,143 | B1 | * | 2/2001 | Ohashi ..................... 438/697 |

FOREIGN PATENT DOCUMENTS

EP   0 455 338   * 11/1991   ....... 438/FOR 430

OTHER PUBLICATIONS

Chao, H.H.; Iyer, S.S.; Ning, T.H.; *Single Device Dram Cell Using Butted Plate*; IBM Technical Disclosure Bulletin, vol. 27, No. 12, May 1985.

* cited by examiner

*Primary Examiner*—A. Dexter Tugbang
(74) *Attorney, Agent, or Firm*—Richard A. Henkler; Dillon & Yudell LLP

(57) ABSTRACT

A capacitor structure is fabricated by forming a bottom plate, forming a dielectric layer overlaying the bottom plate, and forming a top plate over the dielectric layer. In addition, at least one insulating sidewall spacer that protects the dielectric layer during processing is formed along the perimeter of the top plate and overlaying a portion of the dielectric layer.

13 Claims, 5 Drawing Sheets

METHOD OF FABRICATING A CAPACITOR HAVING SIDEWALL SPACER PROTECTING THE DIELECTRIC LAYER

CROSS-REFERENCE TO RELATED APPLICATION

This application is a divisional of U.S. application Ser. No.09/616,951 filed Jul. 14, 2000 now U.S. Pat. 6,344,964 This application is also related to Ser. No. 09/298,122, "Metal-Insulator-Metal Capacitor for Copper Damascene Process and Method of Forming the Same," filed Apr. 23, 1999, and incorporated herein by reference.

BACKGROUND OF THE INVENTION

1. Technical Field

The present invention relates in general to integrated circuitry and, in particular, to capacitors and their fabrication.

2. Description of the Related Art

Precision capacitors for complementary metal oxide semiconductor (CMOS) analog applications are generally metal-insulator-metal (MIM) capacitors or polysilicon-insulator-polysilicon (P-P) capacitors. P-P capacitors are becoming less popular, however, because of the problems connected with their use in conjunction with complementary metal oxide semiconductor (CMOS) technologies. More specifically, P-P capacitors are generally fabricated before CMOS structures, and the heat and oxidation cycles of the CMOS fabrication process degrade P-P capacitors. In addition, as analog circuits become more sophisticated, the allowed variation in the capacitance decreases and is preferably maintained at approximately 50 ppM/V. Because P-P capacitors suffer from carrier depletion (which changes the capacitance) as surface voltage across the P-P capacitor changes, P-P capacitors do not maintain the linearity required in sophisticated analog circuits. Further, P-P capacitors often trap charge within the dielectric during their use.

As a result, MIM capacitors, which are usually formed after the CMOS fabrication process, are becoming more popular for analog circuits. However, MIM capacitors also present manufacturing challenges, especially when used with copper wiring, because copper generally cannot be used as an electrode with an $SiO_2$ dielectric layer. In particular, the present invention recognizes that the etching step(s) utilized to define the simplest MIM capacitor that does not use the underlying damascene metallurgy as an electrode etches the top and bottom plates and the dielectric in one step, and in doing so, creates contamination on the edge of the dielectric that contacts both plates. This contamination is not easy to remove and causes undesirable leakage between the top and bottom plates.

SUMMARY OF THE INVENTION

In view of the foregoing, the present invention provides an improved capacitor structure and method of fabricating a capacitor structure that prevents a contamination layer formed during etching from connecting the top and bottom plates and thereby causing leakage.

A capacitor structure in accordance with the present invention includes a bottom plate, a top plate, and a dielectric layer between the bottom and top plates. In addition, at least one insulating sidewall spacer that protects the dielectric layer during processing is formed along the perimeter of the top plate and overlaying a portion of the dielectric layer. In a preferred embodiment, the sidewall spacer, which may be an oxide insulator, is formed following an etch of the top plate to expose the dielectric layer.

All objects, features, and advantages of the present invention will become apparent in the following detailed written description.

DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

DESCRIPTION OF THE PREFERRED EMBODIMENT

Figure 1:
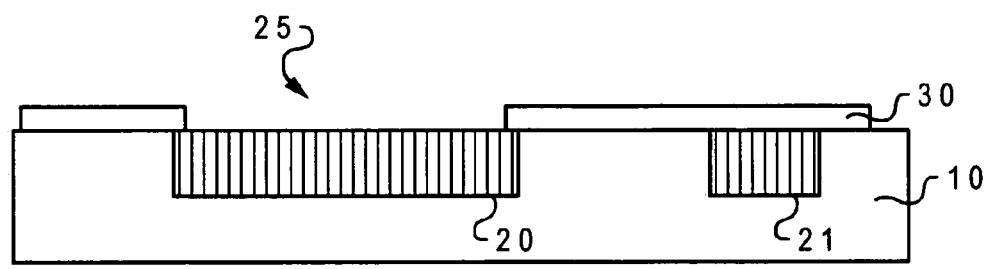
FIG. 1 depicts a side view of a substrate having a metal damascene layer formed therein.

With reference now to the figures and in particular with reference to FIG. 1, there is illustrated a side view of a semiconductor substrate 10 (such as tantalum nitride (TaN), for example) in which openings are formed using conventional masking and etching processes. Metal damascene conductors 20, 21 are then deposited in the openings, and the resulting structure is planarized using, for example, chemical mechanical polishing (CMP). In the preferred embodiment, metal damascene conductors 20, 21 are formed of copper, although other metals such as gold are also suitable.

Subsequently, a silicon nitride ($Si_3N_4$) layer 30 is formed over metal damascene layers 20, 21 and semiconductor substrate 10. Silicon nitride layer 30 is subsequently masked and etched to form an opening 25 in silicon nitride layer 30 to define the location at which a metal-insulator-metal (MIM) capacitor will be formed. The MIM capacitor may be formed without silicon nitride layer 30 if an etch process for the capacitor's bottom plate can be found that does not damage metal damascene conductor 21 when the capacitor layers are defined, as discussed further below.

Figure 2:
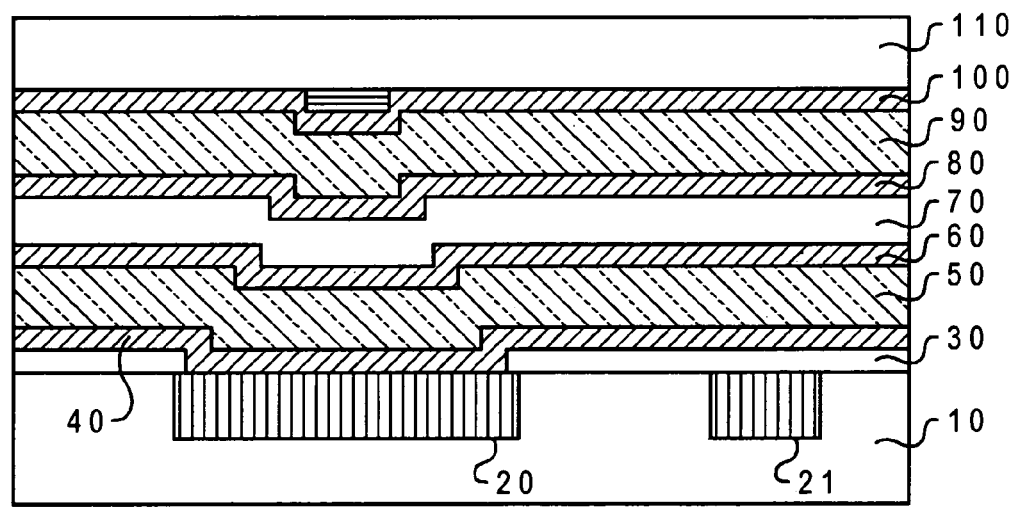
FIG. 2 illustrates a side view of a metal-insulator-metal (MIM) capacitor structure formed over a metal damascene layer in accordance with the present invention, after the layers needed to form the capacitor have been deposited.

Referring now to FIG. 2, there is depicted a side view of a MIM capacitor structure formed over metal damascene conductor 20 in accordance with the present invention. As shown in FIG. 2, a first barrier layer 40 such as tantalum nitride (TaN) may be formed over the silicon nitride layer 30 and in opening 25 such that first barrier layer 40 contacts metal damascene conductor 20. First barrier layer 40 retards diffusion of copper (or other metal) from metal damascene conductor 20 into the capacitor's bottom plate and dielectric layer. A bottom electrode 50, which is preferably a thin layer of aluminum (Al), tungsten (W) or other suitable metal, is then formed over first barrier layer 40. A second barrier layer 60, such as titanium nitride (TiN), may then be formed over the bottom electrode 50. Second barrier layer 60 retards diffusion of the metal in bottom electrode 50 into dielectric layer 70. First barrier layer 40, bottom electrode 50, and second barrier layer 60 together form the bottom plate of the capacitor.

A dielectric layer 70, which is preferably made of silicon dioxide ($SiO_2$), may then be formed over second barrier layer 60, and a third barrier layer 80, which is preferably formed of titanium nitride (TiN), may then be formed over dielectric layer 70. Overlaying third barrier layer 80 is a top electrode 90 formed of aluminum or any other suitable metal. FIG. 2 further illustrates that a fourth barrier layer 100, formed of tantalum nitride (TaN) or other suitable barrier material, may be formed over top electrode 90. Third barrier layer 80, top electrode 90, and fourth barrier layer 100 together form the top plate of the capacitor. Over the top of the MIM capacitor structure, a silicon dioxide ($SiO_2$) or other insulator layer 110 is thereafter preferably formed to prevent charge leakage.

The foregoing layers can be formed using any conventional process, such as chemical vapor deposition (CVD), sputtering, evaporation, etc. If the conductivity of barrier layers 100 and 40 is sufficient (i.e., the resistivity is not too high), then layers 30, 60 and 80 may be omitted from the MIM capacitor structure.

Following the formation of the MIM capacitor structure illustrated in FIG. 2, portions of the various layers are removed in order to define a MIM capacitor of the desired size, as described in detail below with respect to FIGS. 3–7. Generally, in order to reduce process steps, conventional capacitors have been defined by a continuous etching process that etches through the top plate, dielectric layer and bottom plate, stopping on the underlying substrate. However, as noted above, this conventional etching process exposes the capacitor dielectric surface at the perimeter of the plates during etching, which leads to contamination forming a connection between the top and bottom plates of the capacitor. As a result, undesirable charge leakage occurs between the top and bottom plates of the capacitor. Accordingly, the present invention forms at least one protective sidewall spacer that encloses the top plate (e.g., layers 80, 90 and 100) in a protective insulator coating, while the capacitor dielectric (e.g., layer 70) and bottom plate (e.g., layers 40, 50 and 60) are etched.

Figure 3:
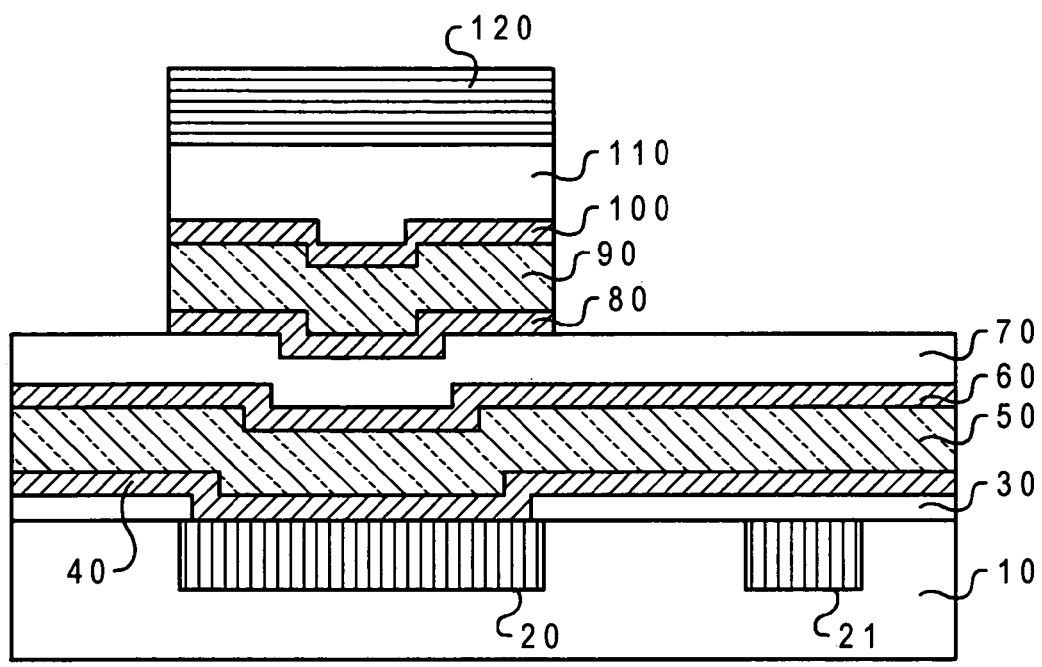
FIG. 3 depicts a side view of a MIM capacitor structure following a top plate etch.

Referring now to FIG. 3, after the formation of the layers of the MIM capacitor structure discussed above, a photo mask 120 is applied over the MIM capacitor structure and patterned utilized conventional techniques. Photo mask 120 defines the geometry and location of the capacitor top plate. An etch of layers 110, 100, 90 and 80 is then performed, with the etch stopping at the interface between dielectric layer 70 and third barrier layer 80 (or top electrode 90, if third barrier layer 80 is omitted). Photo mask 120 is thereafter stripped away.

Figure 4:
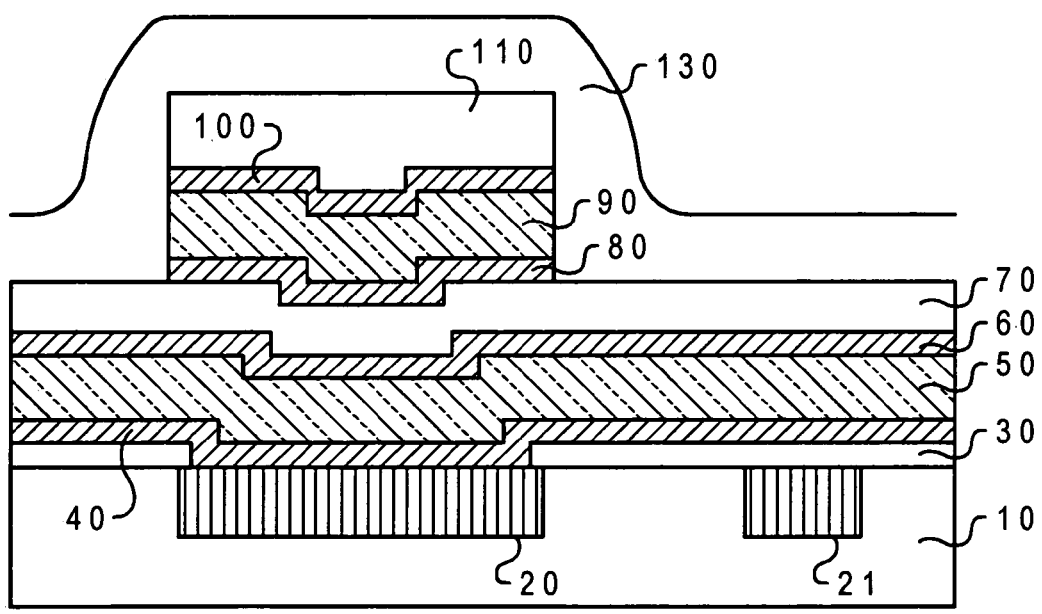
FIG. 4 illustrates a side view of a MIM capacitor structure following formation of an insulating layer.
Figure 5:
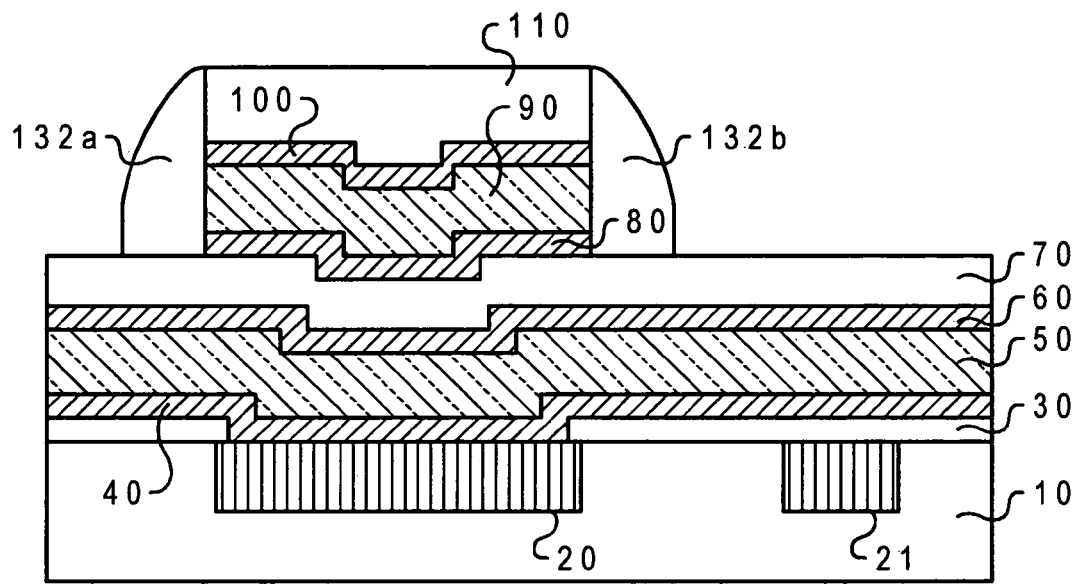
FIG. 5 depicts a side view of a MIM capacitor structure following formation of sidewall spacers that protect the dielectric layer.
Figure 6:
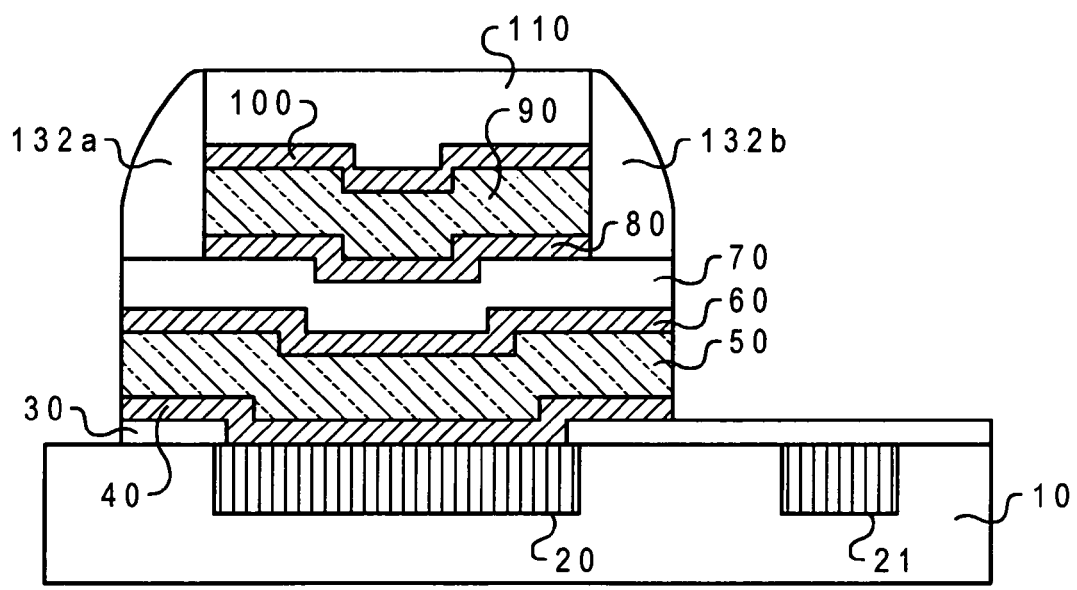
FIG. 6 depicts a side view of a MIM capacitor structure following etching of the dielectric layer and bottom plate.

Next, as depicted in FIGS. 4 and 5, to protect dielectric layer 70 during later etching, a conformal layer of an insulator 130 such as silicon dioxide ($SiO_2$) is formed (e.g., deposited) and then etched to form one or more sidewall spacers 132a and 132b surrounding the perimeter of the top plate (e.g., layers 80, 90 and 100) and insulator 110. Thus, when dielectric layer 70 and the bottom plate (e.g., layers 40, 50 and 60), are subsequently etched, as illustrated in FIG. 6, sidewall spacers 132 prevent contamination from the etching process connecting the top plate (e.g., layers 80, 90 and 100) to the bottom plate (e.g., layers 30, 40 and 50) and causing charge leakage.

Figure 7:
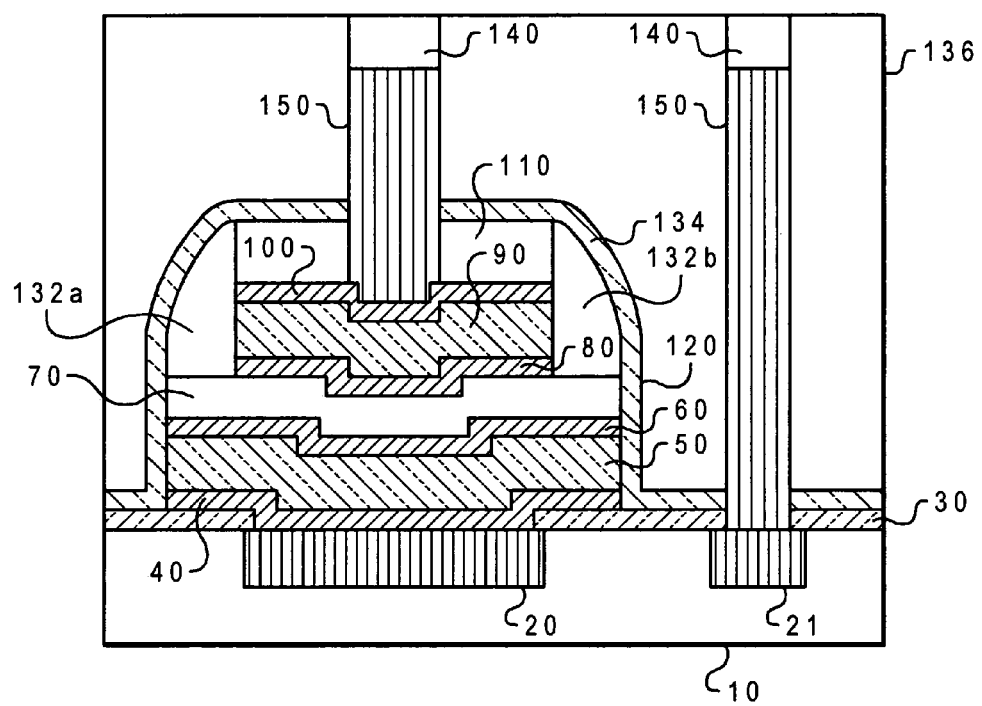
FIG. 7 illustrates a side view of a completed MIM capacitor in accordance with the present invention.

Subsequently, as shown in FIG. 7, a barrier layer 134, preferably made of silicon nitride ($Si_3N_4$), may be applied over the top and sides of the MIM capacitor using conventional deposition techniques such as those mentioned above to thereby surround portions of the capacitor stack (and specifically dielectric layer 70). An interlayer dielectric (ILD) 136 is then deposited over the entire MIM capacitor stack and may be subsequently planarized using processes well known in the art, such as CMP. Thereafter, the MIM capacitor is ready for via connections 150 to both top plate of the metal-insulator-metal capacitor and metal damascene conductor 21 using processes well known in the art, such as lithographic masking, etching and conductive stud formation. Via connections 150 may be further connected to a next layer of metal damascene wiring 140.

Figure 8:
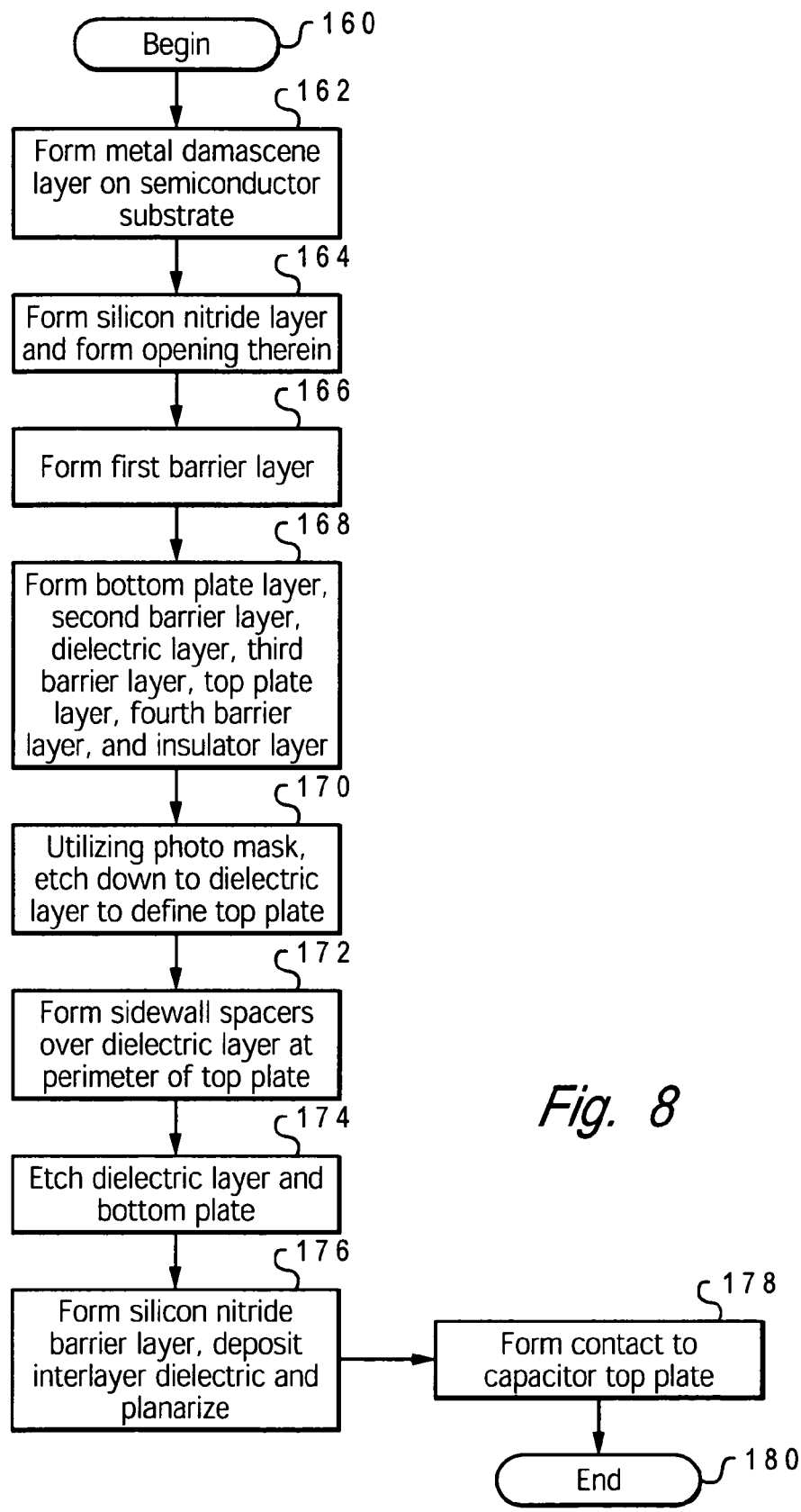
FIG. 8 depicts a high level flowchart of a preferred process for fabricating a MIM capacitor in accordance with the present invention.

Referring now to FIG. 8, there is illustrated a flowchart of a preferred method of forming a MIM capacitor in accordance with the present invention. The process begins at block 160 and thereafter proceeds to block 162, which illustrates the formation of metal damascene conductors 20, 21 in semiconductor substrate 10. Next, at block 164, $Si_3N_4$ layer 30 is formed over substrate 10, and an opening is etched in $Si_3N_4$ layer 30. As noted above, if overetching of metal damascene conductors 20–21 is not a concern, then block 164 can optionally be omitted. A first barrier layer 40 is then added at block 166 that contacts metal damascene conductor 20. At block 168, the remainder of the MIM capacitor structure is formed by sequentially forming bottom electrode 50, second barrier layer 60, dielectric layer 70, third barrier layer 80, top electrode 90 and fourth barrier layer 100. In addition, an overlying insulator layer 110 may optionally be formed in order to retard charge leakage.

Thereafter, as depicted at block 170, a photo mask 120 is utilized to pattern capacitor top plate (e.g., layers 80, 90 and 100) in an etch back of the capacitor stack stopping on dielectric layer 70. Next, as shown at block 172, one or more sidewall spacers 132 are formed around the perimeter of the top plate and over dielectric layer 70 through the deposition and etching of silicon dioxide, for example. Sidewall spacers 132 protect dielectric layer 70 from overetching and contamination during the subsequent etch of dielectric layer 70 and the bottom plate (e.g., layers 40, 50 and 60), which is depicted at block 174. The etch of the bottom plate stops on silicon nitride layer 30, if present.

After the essential structure of the MIM capacitor has been defined by the foregoing etching steps, capacitor fabrication continues at block 176, which depicts forming silicon nitride layer 134 on the top and sides of the capacitor stack and depositing and planarizing interlayer dielectric 136. Finally, as illustrated at block 178, contacts 150 to the top plate and metal damascene conductor 21 are formed, and wiring 140 is deposited in a conventional manner. Thereafter, the process ends at block 180.

As has been described, the present invention provides an improved capacitor and method of capacitor fabrication that reduce charge leakage between the capacitor plates by protecting the capacitor dielectric with insulating sidewall spacers during etching.

While the invention has been particularly shown and described with reference to a preferred embodiment, it will be understood by those skilled in the art that various changes in form and detail may be made therein without departing from the spirit and scope of the invention. In particular, those skilled in the art will appreciate that the formation of protective sidewall spacers in accordance with the present invention, although particularly suitable for use in MIM capacitor fabrication, may also be employed in the fabrication of types of capacitor structures.

What is claimed is:

1. A method of fabricating a capacitor structure on a semiconductor substrate, said method comprising:
    forming a metallic bottom plate over the semiconductor substrate;
    forming a dielectric layer overlaying the bottom plate;
    forming over the dielectric layer a top plate having a smaller area than said bottom plate, said top plate having a perimeter; and
    forming at least one insulating sidewall spacer placed against said perimeter of said top plate and overlaying a portion of said dielectric layer, wherein forming the at least one insulating sidewall spacer comprises forming the at least one insulating sidewall spacer on a top surface of the dielectric layer.

2. The method of claim 1, and further comprising:
    prior to forming said at least one insulating sidewall spacer, etching said top plate to expose said dielectric at said perimeter of said top plate.

3. The method of claim 1, wherein:
    said method further comprises forming a conductor embedded in the semiconductor substrate; and
    forming the bottom plate comprises forming the bottom plate overlaying and in electrical contact with the conductor.

4. The method of claim 3, wherein forming the conductor comprises forming a copper damascene structure.

5. The method of claim 3, wherein forming said bottom plate comprises forming a conductive hairier layer in contact with said conductor.

6. The method of claim 1, wherein said step of forming the top plate comprises forming a metallic plate.

7. The method of claim 1, wherein forming the dielectric layer comprises forming a silicon dioxide layer.

8. The method of claim 1, and further comprising forming an insulating cap overlaying said top plate.

9. The method of claim 8, wherein said insulating cap has a perimeter coextensive with said top plate, and wherein forming said at least one insulating sidewall spacer comprising forming said at least one insulating sidewall spacer against said perimeter of said insulating cap.

10. The method of claim 8, and further comprising forming a conductive via through said insulating cap and in electrical contact with said top plate.

11. The method of claim 1, wherein forming the at least one insulating sidewall spacer comprises forming the at least one insulating sidewall spacer overlaying a portion of said bottom plate.

12. The method of claim 1, and further comprising:
    forming a copper damascene conductor in the semiconductor substrate underlying said bottom plate.

13. The method of claim 1, and further comprising forming an etch stop layer overlaying said semiconductor substrate prior to forming said bottom plate, wherein at least a portion of said bottom plate overlays said etch stop layer.

* * * * *

UNITED STATES PATENT AND TRADEMARK OFFICE
CERTIFICATE OF CORRECTION

PATENT NO. : 6,993,814 B2
APPLICATION NO. : 10/057185
DATED : February 7, 2006
INVENTOR(S) : Eric Adler It is certified that error appears in the above-identified patent and that said Letters Patent is hereby corrected as shown below:

In Claim 5, at column 6, line 4, delete "hairier" and insert --barrier--.

Signed and Sealed this

First Day of August, 2006

JON W. DUDAS
*Director of the United States Patent and Trademark Office*